United States Patent [19]

Zimmermann et al.

[11] Patent Number: 4,935,627

[45] Date of Patent: Jun. 19, 1990

[54] ELECTRICAL INTERCONNECTION APPARATUS FOR ACHIEVING PRECISE ALIGNMENT OF HYBRID COMPONENTS

[75] Inventors: Peter H. Zimmermann; Joseph L. Schmit, both of Lexington, Mass.

[73] Assignee: Honeywell Inc., Minneapolis, Minn.

[21] Appl. No.: 322,352

[22] Filed: Mar. 13, 1989

[51] Int. Cl.[5] .................. H01L 23/48; H01L 23/13
[52] U.S. Cl. .................. 250/338.4; 357/68; 250/332
[58] Field of Search .............. 250/330, 332, 338.1, 250/338.4, 349, 370.01, 370.08, 370.013; 357/68, 69

[56] References Cited

U.S. PATENT DOCUMENTS

| | | | |
|---|---|---|---|
| 3,380,155 | 4/1968 | Burks | 437/183 |
| 3,458,925 | 8/1969 | Napier et al. | 437/183 |
| 3,470,611 | 10/1969 | McIver et al. | 437/9 |
| 3,757,075 | 9/1973 | Munt | 219/121.69 |
| 3,997,963 | 12/1976 | Riseman | 437/182 |
| 4,072,863 | 2/1978 | Roundy | 250/332 |
| 4,104,785 | 8/1978 | Shiba et al. | 437/8 |
| 4,466,184 | 8/1984 | Cuneo et al. | 29/830 |
| 4,545,610 | 10/1985 | Lakritz et al. | 437/180 |
| 4,600,970 | 7/1986 | Bauer | 361/403 |
| 4,651,191 | 3/1987 | Oove et al. | 357/71 |
| 4,670,653 | 6/1987 | McConkle et al. | 250/330 |
| 4,740,700 | 4/1988 | Shaham et al. | 250/332 |
| 4,754,316 | 6/1988 | Reid | 357/68 |

OTHER PUBLICATIONS

F. Lavanant and J. L. Mathis, Chip-To-Terminal Interconnection Technique, vol. 14, No. 6, Nov. 1971, IBM Technical Disclosure Bulletin.

Primary Examiner—Constantine Hannaher
Assistant Examiner—Edward J. Glick
Attorney, Agent, or Firm—Haugen and Nikolai

[57] ABSTRACT

Apparatus for electrically interconnecting a focal plane array component of infrared detectors to a second focal plane array component of electronics, such as multiplexers. First and second interconnecting members are comprised of indium bumps wherein the bumps are of generally rectangular shape and of nonparallel orientation, typically crossing at 90° angles. An alternative embodiment uses bumps of generally round shape wherein one of the bumps is of a smaller surface area than the other.

21 Claims, 2 Drawing Sheets

ELECTRICAL INTERCONNECTION APPARATUS FOR ACHIEVING PRECISE ALIGNMENT OF HYBRID COMPONENTS

U.S. GOVERNMENT RIGHTS

The U.S. Government has funded a portion of the development of this invention and has certain rights therein.

BACKGROUND OF THE INVENTION

This invention is directed generally to apparatus for electrically interconnecting electrical elements, and, more particularly, to electrical bump interconnections for use in connecting hybrid focal plane array components to each other as used in electromagnetic sensing devices, such as infrared sensing devices.

DISCUSSION OF THE PRIOR ART

Bump bonding has been used for a number of years for joining infrared detector array pixels to associated electronics such as multiplexer circuits. Such interconnection bumps provide both electrical, thermal and mechanical interconnects in hybrid Focal Plane Arrays (FPAs) at room temperature as well as at cryogenic temperatures. The detector pixels are typically comprised of material sensitive to receiving electromagnetic radiation, such as infrared radiation. One such material commonly employed is mercury cadmium telluride (HgCdTe). The associated multiplexer electronics are usually embedded in CMOS packaging comprised typically of silicon. FPAs usually employ solid metal bumps as, for example, indium bumps for achieving a cold weld interconnection between the multiplexer electronics and the infrared detector pixels. Examples of such focal planes include photovoltaic (hereinafter also called "PV") HgCdTe-Si, PV InSb-Si, PtSi-Si, and extrinsic Si-Si focal planes. Prior art configurations such as is schematically shown in FIG. 1 typically use opposing bumps, such as bumps 10 and 40 in the figure, of the same shape, material and cross-section. For optimum bump-bonding integrity, the opposing bumps are aligned for maximum overlap. This criteria for optimum bump bonding integrity, however, is at odds with another important objective in this art of achieving maximum buttibility of FPAs.

In the construction of focal planes consisting of several such arrays, it is often desirable to butt adjacent arrays together with the objective of minimizing outages at the butt joints. To achieve this maximum buttibility of FPAs, it is desirable in some configurations to optimize the alignment of the envelope (or other feature) of the HgCdTe arrays to the envelope (or other feature) of the multiplexer assemblies. FIG. 1 shows schematically an illustration of an infrared detector array 20 having interconnect bumps 10 being aligned to the envelope of a multiplexer assembly 30 having a second set of interconnect bumps 40. This simple illustration of aligning one pixel will illuminate the difficulties in aligning several detector arrays with one or more multiplexer assemblies wherein each focal plane array contains a plurality of detector pixels. Continuing with this illustrative example, one can see that if the objective is to align the envelopes 20 and 30 along the X,Y plane by aligning the four corners of the FPA along lines A through D, it is immediately recognized that, unless bumps 10 and 40 are perfectly aligned in the X,Y space, that maximizing the alignment of the two envelopes 20 and 30 conflicts with maximizing the alignments of bumps 10 and 40. In a typical case if bump 10 is centered at point X1, Y1 and bump 40 is centered at point X2, Y2, then if the upper lefthand corners of both envelopes joined by line D are aligned, some error in alignment, M, will occur between bumps 10 and 40 since their centers will occupy different coordinates in the X-Y plane. Therefore, maximizing the indium bump overlap is in conflict with optimizing the envelope alignment.

In addition, another very important issue is that indium bumps of equal dimension are inherently unstable against lateral motion during typical bump bonding operations because any deviation in alignment will result in a lateral force during bump bonding. This lateral force becomes larger as the indium bump height is increased approaching or exceeding its own diameter, which those skilled in the art will recognize as optimum for achieving good coldwelds. This lateral force tends to increase the misalignment between the joining bumps during bump bonding causing a relative shift of the two parts to be bonded away from the intended alignment. Finally, misalignment between bumps may result in variations in bump-to-bump overlap areas across the focal plane array and thus in potentially undesirable nonuniform bonds across the focal plane.

The invention overcomes the above noted deficiencies in the prior art through using differently oriented interconnection bumps of the same shape on two opposing joining focal plane surfaces in such a manner that the overlap area of the bumps becomes insensitive to small excursions from optimum alignment. An alternate configuration of the invention uses two bumps of different cross-sectional areas to join two such hybrid components.

SUMMARY OF THE INVENTION

A means for electrically interconnecting a first electrical element to a second electrical element is disclosed. The electrical interconnection means comprises a first interconnection member having a first geometric shape and orientation connected to the first electrical element and a second interconnection member having substantially the same geometric shape as the first interconnection member but a substantially nonparallel orientation with respect to the first member being connected to the second electrical element.

Alternatively, the first interconnection member may have a surface area larger than the surface area of the second interconnection member.

It is a primary objective of the invention to provide differently oriented electrical interconnect members of the same shape on two opposing joining focal plane surfaces in such a manner that the overlap area of the interconnect members becomes insensitive to small excursions from optimum alignment of the members.

It is another object of the invention to provide an alternate configuration of electrical interconnect members for use in connecting focal plane surfaces wherein a first interconnect member has a different cross-sectional area than the second interconnect member in such a manner that the overlap area of the interconnect members becomes insensitive to small excursions from optimum alignment of the members.

Other objects, features and advantages of the invention will become apparent to those skilled in the art through reference to the description, claims and drawings herein where like numerals refer to like elements.

DETAILED DESCRIPTION OF THE PREFERRED EMBODIMENTS

Figure 1:
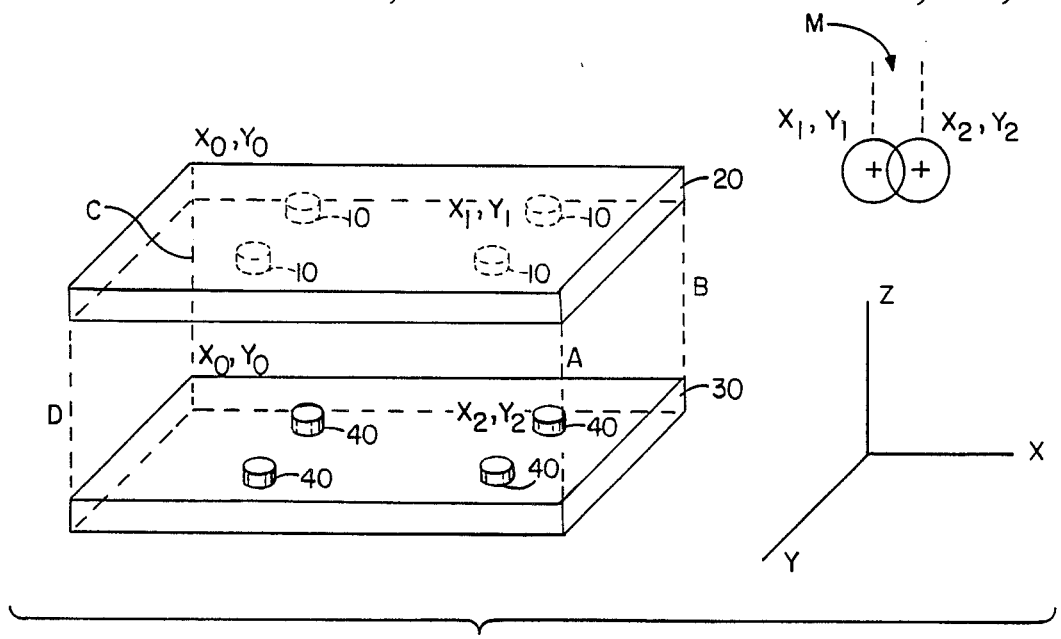
FIG. 1 shows schematically an illustration of maximizing alignment buttibility of focal plane arrays using interconnect structures of the prior art.
Figure 2A:
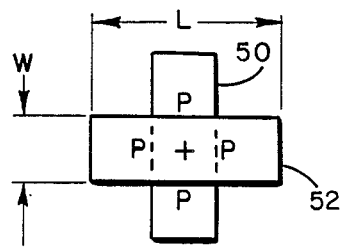
FIG. 2A shows schematically a top view of two electrical interconnects of the invention exhibiting optimum alignment.
Figure 2B:
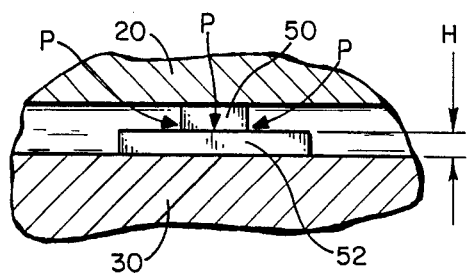
FIG. 2B shows a front or side view of two interconnect members of the present invention exhibiting optimum alignment.

Referring now to FIG. 2A with continuing reference to FIG. 1, the preferred embodiment of the invention is shown schematically. FIG. 2A shows first and second interconnect bumps 50 and 52, respectively. These interconnects may be comprised of, for example, solid indium as is typically found in infrared detector technology or other similar metals. Referring to FIG. 2B, a front or side view of the interconnect members 50 and 52 is shown. Interconnect members 50 and 52 are mounted to focal plane array components 20 and 30. Focal array component 20 may be, for example, a focal plane array comprised of a plurality of mercury cadmium telluride detector pixels. Focal plane array component 30 may be, for example, a semiconductor chip comprised of multiplexer electronics for processing information from the detector pixels. Interconnect bumps 50 and 52 electrically connect the detectors to the associated multiplexer electronics. FIGS. 2A and 2B generally show the interconnect bumps 50 and 52 in an optimum alignment configuration. The optimum geometry as shown in FIGS. 2A and 2B has two bumps of rectangular cross-section rotated by about 90° with respect to each other on opposing sides of the hybrid assembly as shown in FIG. 1. For the purposes of describing the invention define the width of a bump to be W and the length as L. The overlap area of the two bumps when cold welded is equal to $W^2$. For $L=3W$ this area is insensitive to misalignments of approximate $W/2$ as long as the height of each bump is less than about W. More generally, lateral forces during bump bonding are minimized if the misalignment, called "M" herein, is kept to approximately $(L-W-H)/2$ where H is defined as the height or thickness of one bump as shown in FIG. 2B.

As those skilled in the art will realize, for good cold welding the configuration shown in FIG. 2A achieves high shear between the two bumps where the perimeter of one bump meets the other bump, especially at the lines labelled P where both bump perimeters meet.

Figure 3A:
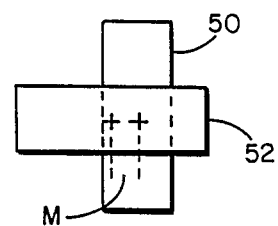
FIG. 3A schematically shows a top view of the interconnect members of the invention exhibiting a misalignment.
Figure 3B:
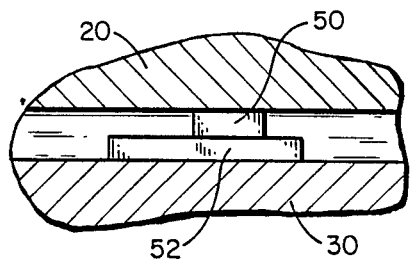
FIG. 3B shows a front view of two interconnect members of the invention in misalignment.

FIGS. 3A and 3B show the interconnect bumps of the invention in misalignment where the misalignment M is less than $(L-W-H)/2$ and, therefore, still provides acceptable interconnection and alignment as provided by the invention.

Figure 4A:
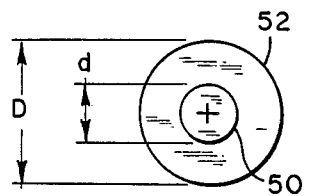
FIG. 4A shows a top view of two interconnect members of the invention having generally circular shapes in optimum alignment.
Figure 5A:
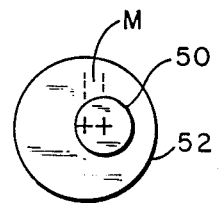
FIG. 5A shows a top view of two interconnect members of generally circular shape of the present invention in misalignment.
Figure 4B:
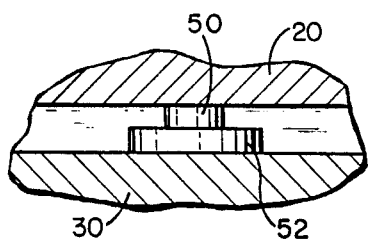
FIG. 4B shows a front or side view of the interconnect members shows in FIG. 4A.
Figure 5B:
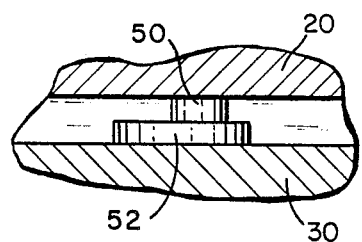
FIG. 5B shows a front view of the interconnect members of FIG. 5A.

One alternate embodiment of the invention is shown in FIGS. 4A, 4B, 5A and 5B. In these configurations, an example of a generally round bump configuration using two different diameters designated "d" and "D" for the smaller and larger diameters, respectively, is shown. FIGS. 4A and 4B show top and front or side views of an optimum alignment of the alternate embodiment of the invention. FIGS. 5A and 5B show top and front views of a misaligned configuration using the interconnect bumps of the inventions where the misalignment M is less than $(D-d-H)/2$. As those skilled in the art can appreciate, the shear during bump bonding is a smaller force than with the preferred cross bar bump configuration as shown in FIGS. 2 and 3 herein.

Those skilled in the art will recognize that other alternative embodiments are possible using various combinations of the illustrated embodiments herein. For example, one can use any geometric shape for a first interconnect bump member where it has a larger surface area than a second bump interconnect member within the bounds of the misalignment perimeters outlined herein. Also, the interconnect structure of the invention is not limited to use in infrared focal plane arrays, but may be used for any type of electromagnetic sensing system where similar interconnect mechanisms are typically used for various other types of electronic packages.

While the invention has been particularly shown and described in detail with reference to the preferred embodiments thereof, it will be understood by those skilled in the art that the foregoing and other changes in form and details may be made therein without departing from the spirit and scope of the invention.

What is claimed is:

1. An apparatus having a means for electrically interconnecting a first electrical element to a second electrical element for use in an electromagnetic sensing device comprising: a first interconnection member having a generally rectangular shape and a first orientation, the first interconnection member being connected to the first electrical element; and a second interconnection member having a generally rectangular shape and an orientation which is substantially nonparallel with respect to the first interconnection member, the second interconnection member being electrically connected to the second electrical element.

2. The apparatus of claim 1 wherein the first and second interconnection members are comprised of indium.

3. The apparatus of claim 1 wherein the first electrical element is part of a CMOS multiplexer array.

4. The apparatus of claim 1 wherein the first and second interconnection members have orientations about 90° out of alignment with each other.

5. The apparatus of claim 1 wherein the electromagnetic sensing system is an infrared system.

6. The apparatus of claim 1 wherein the first electrical element is an infrared detector pixel.

7. The apparatus of claim 6 wherein the infrared pixel is comprised of mercury cadmium telluride material.

8. An apparatus having a means for electrically interconnecting a first electrical element to a second electrical element in an electromagnetic sensing device comprising: a first interconnection member being connected to the first electrical element and a second interconnection member having a smaller surface area than the first interconnection member and being connected to the second electrical element.

9. The apparatus claimed in claim 8 wherein the first and second interconnection members are comprised of indium.

10. The apparatus of claim 8 wherein the first electrical element is part of a CMOS multiplexer array.

11. The apparatus of claim 8 wherein the first and second interconnection members are generally circular in geometric shape.

12. The apparatus of claim 8 wherein the electromagnetic sensing system is an infrared system.

13. The apparatus of claim 8 wherein the first electrical element is an infrared detector pixel.

14. The apparatus of claim 13 wherein the infrared pixel is comprised of mercury cadmium telluride material.

15. The apparatus of claim 1 wherein the first electrical element is embedded in a semiconductor electronic chip.

16. The apparatus of claim 8 wherein the first electrical element is embedded in a semiconductor electronic chip.

17. An apparatus having a means for electrically interconnecting a focal plane array having a plurality of detector pixels in one envelope and a plurality of electronic devices in a second envelope for use in an infrared sensing system comprising: a first plurality of interconnection members each having a generally rectangular shape and a first orientation, the plurality of first interconnection members being connected individually to the detector pixels; and a second plurality of interconnection members each having a generally rectangular shape and an orientation which is substantially nonparallel with respect to the plurality of first interconnection members, the plurality of second interconnection members being electrically connected individually to the electronic devices.

18. The apparatus claims in claim 17 wherein the first and second interconnection members are comprised of indium.

19. The apparatus of claim 17 wherein the plurality of electronic devices comprise a CMOS multiplexer array.

20. The apparatus of claim 17 wherein the plurality of electronic devices comprise a multiplexer array.

21. The apparatus of claims 1 or 8 wherein the first electrical element is part of a multiplexer array.

* * * * *